(12) United States Patent
Takamoto et al.

(10) Patent No.: US 11,366,157 B2
(45) Date of Patent: Jun. 21, 2022

(54) BURN-IN BOARD AND BURN-IN DEVICE

(71) Applicant: ADVANTEST Corporation, Tokyo (JP)

(72) Inventors: Tomoyuki Takamoto, Tokyo (JP); Akihiko Ito, Tokyo (JP); Takashi Kawashima, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 372 days.

(21) Appl. No.: 16/575,746

(22) Filed: Sep. 19, 2019

(65) Prior Publication Data
US 2020/0233027 A1     Jul. 23, 2020

(30) Foreign Application Priority Data
Jan. 21, 2019 (JP) .............................. JP2019-007504

(51) Int. Cl.
*G01R 31/28* (2006.01)
(52) U.S. Cl.
CPC ................................ *G01R 31/2849* (2013.01)
(58) Field of Classification Search
None
See application file for complete search history.

(56) References Cited

U.S. PATENT DOCUMENTS

| 6,160,394 A | 12/2000 | Kasai et al. |
| 6,815,966 B1 * | 11/2004 | Gunn ................. G01R 31/2863 |
| | | 324/750.05 |
| 2006/0186909 A1 | 8/2006 | Aube et al. |
| 2007/0161228 A1 * | 7/2007 | Nakamura ........ H01L 23/49838 |
| | | 438/622 |

FOREIGN PATENT DOCUMENTS

| CN | 1847859 A | 10/2006 |
| CN | 101017182 A | 8/2007 |
| CN | 101675350 A | 3/2010 |
| CN | 101750558 A | 6/2010 |
| CN | 101765783 A | 6/2010 |
| CN | 107329064 A | 11/2017 |

(Continued)

OTHER PUBLICATIONS

Translation of JP 2004-356492 A (Year: 2004).*

(Continued)

*Primary Examiner* — Jermele M Hollington
(74) *Attorney, Agent, or Firm* — Osha Bergman Watanabe & Burton LLP

(57) ABSTRACT

A burn-in board capable of realizing a uniform temperature distribution inside a burn-in board is provided. A burn-in board includes: a plurality of sockets; a burn-in board body including an upper surface for mounting the sockets thereon and a lower surface on the side opposite to the upper surface; a reinforcement frame contacting the lower surface; a bottom cover contacting the reinforcement frame; a heat conduction plate interposed between the burn-in board body and the bottom cover; and a heat conduction sheet thermally connecting the burn-in board body to the heat conduction plate, in which the reinforcement frame presses the heat conduction plate toward the heat conduction sheet.

16 Claims, 12 Drawing Sheets

(56) References Cited

FOREIGN PATENT DOCUMENTS

| | | | |
|---|---|---|---|
| JP | H11-094900 A | 4/1999 | |
| JP | 2001-337127 A | 12/2001 | |
| JP | 2004356492 A * | 12/2004 | ............. G06F 1/206 |
| JP | 2006-090805 A | 4/2006 | |
| JP | 2009-236922 A | 10/2009 | |
| JP | 2010-066091 A | 3/2010 | |
| JP | 2010-122182 A | 6/2010 | |
| JP | 2010-216928 A | 9/2010 | |
| JP | 2012-242132 A | 12/2012 | |
| JP | 2014025829 A | 2/2014 | |
| KR | 10-2014-0130249 A | 11/2014 | |
| SG | 185863 A1 | 12/2012 | |

OTHER PUBLICATIONS

Notice of Reasons for Refusal issued in corresponding Japanese Patent Application No. 2019-007504 dated Dec. 22, 2020 (4 pages).
Office Action issued in counterpart Chinese Patent Application No. CN 201910851033.X dated Dec. 3, 2021 (11 pages).

* cited by examiner

BURN-IN BOARD AND BURN-IN DEVICE

TECHNICAL FIELD

The present invention relates to a burn-in board and a burn-in device.

The present application claims priority from Japanese Patent Application No. 2019-007504 filed on Jan. 21, 2019. The contents described and/or illustrated in the documents relevant to the Japanese Patent Application No. 2019-007504 will be incorporated herein by reference as a part of the description and/or drawings of the present application.

BACKGROUND ART

A burn-in device which applies heat stress to a device under test (DUT) by circulating heated or cooled air in a thermostatic room is known (for example, see Patent Document 1).

CITATION LIST

Patent Document

Patent Document 1: JP 2014-025829 A

SUMMARY OF THE INVENTION

Problem to be Solved by the Invention

In recent years, since there is a tendency that the self-heating of the DUT and the heat generated from the burn-in board body and the sub-board increase, a problem arises in that the temperature distribution inside the burn-in board becomes non-uniform only by the circulation of air.

An object of the invention is to provide a burn-in board and a burn-in device capable of realizing a uniform temperature distribution within a burn-in board.

Means for Solving Problem

[1] A burn-in board according to the invention is a burn-in board including: sockets; a first wiring board including a first main surface on which the sockets are mounted and a second main surface being on the side opposite to the first main surface; a reinforcement member contacting the second main surface; a first plate contacting the reinforcement member; a second plate interposed between the first wiring board and the first plate; and a heat conductor thermally connecting the first wiring board to the second plate, in which the reinforcement member presses the second plate toward the heat conductor.

[2] In the invention above, the reinforcement member may include a main body and a convex portion protruding from the main body toward the first wiring board, the second plate may have a first through-hole into which the convex portion is inserted, the convex portion may contact the first wiring board, and the main body may contact the second plate.

[3] In the invention above, the first wiring board may include a first connector mounted on the second main surface, the burn-in board may further include a second wiring board which includes a second connector connected to the first connector and which is interposed between the second plate and the first plate, and the second plate may have a second through-hole into which at least one of the first and second connectors is inserted.

[4] Further, a burn-in board according to the invention is a burn-in board including: sockets; a first wiring board including a first main surface on which the sockets are mounted and a second main surface which is on the side opposite to the first main surface and on which a first connector is mounted; a reinforcement member contacting the second main surface; a first plate contacting the reinforcement member; a second wiring board which includes a second connector connected to the first connector and which is interposed between the first wiring board and the first plate; and a heat conductor provided between the second wiring board and the first plate and thermally connecting the second wiring board to the first plate.

[5] In the invention above, the first plate may have third through-holes.

[6] In the invention above, the density of the third through-hole of the first plate may increase from one end toward the other end of the first plate.

[7] In the invention above, the number of the third through-holes per unit area of the first plate may increase from one end toward the other end of the first plate.

[8] In the invention above, third through-holes of the first plate may increase in size from one end toward the other end of the first plate.

[9] In the invention above, the first plate may include a first fin standing on a circumferential edge of the third through-hole.

[10] In the invention above, the first fin may be disposed on the other end side with respect to the third through-hole.

[11] In the invention above, the second plate may have fourth through-holes.

[12] In the invention above, the density of the fourth through-hole of the second plate may increase from one end toward the other end of the second plate.

[13] In the invention above, the number of the fourth through-holes per unit area of the second plate may increase from one end toward the other end of the second plate.

[14] In the invention above, fourth through-holes of the second plate may increase in size from one end toward the other end of the second plate.

[15] In the invention above, the second plate may include a second fin standing on a circumferential edge of the fourth through-hole.

[16] In the invention above, the second fin may be disposed on the other end side with respect to the fourth through-hole.

[17] In the invention above, the burn-in board may further include a shielding member extending along the outer edge of the first wiring board and the shielding member, in plan view, may be interposed between the outer edge of the first wiring board and a row of the sockets arranged along the outer edge.

[18] In the invention above, the reinforcement member may be a lattice-shaped member contacting a region corresponding to a gap between the sockets of the second main surface.

[19] In the invention above, the burn-in board may further include an outer frame to which the first wiring board is fixed and to which the first plate is fixed and the reinforcement member may be disposed on the inside of the outer frame.

[20] A burn-in device according to the invention is a burn-in device including the above-described burn-in board.

Effect of the Invention

In the invention, the heat conductor is interposed between the first wiring board and the second plate and the reinforcement member presses the second plate toward the heat conductor so that the first wiring board is thermally connected to the second plate. Accordingly, since the heat generated by the DUT or the burn-in board body is diffused to the second plate via the heat conductor, a uniform temperature distribution inside the burn-in board can be obtained.

Further, in the invention, the second wiring board connected to the first wiring board by the first and second connectors is thermally connected to the first plate by the heat conductor. Accordingly, since the heat generated by the second wiring board is diffused to the first plate via the heat conductor, a uniform temperature distribution inside the burn-in board can be obtained.

MODE(S) FOR CARRYING OUT THE INVENTION

Hereinafter, embodiments of the invention will be described with reference to the drawings.

First Embodiment

Figure 1:
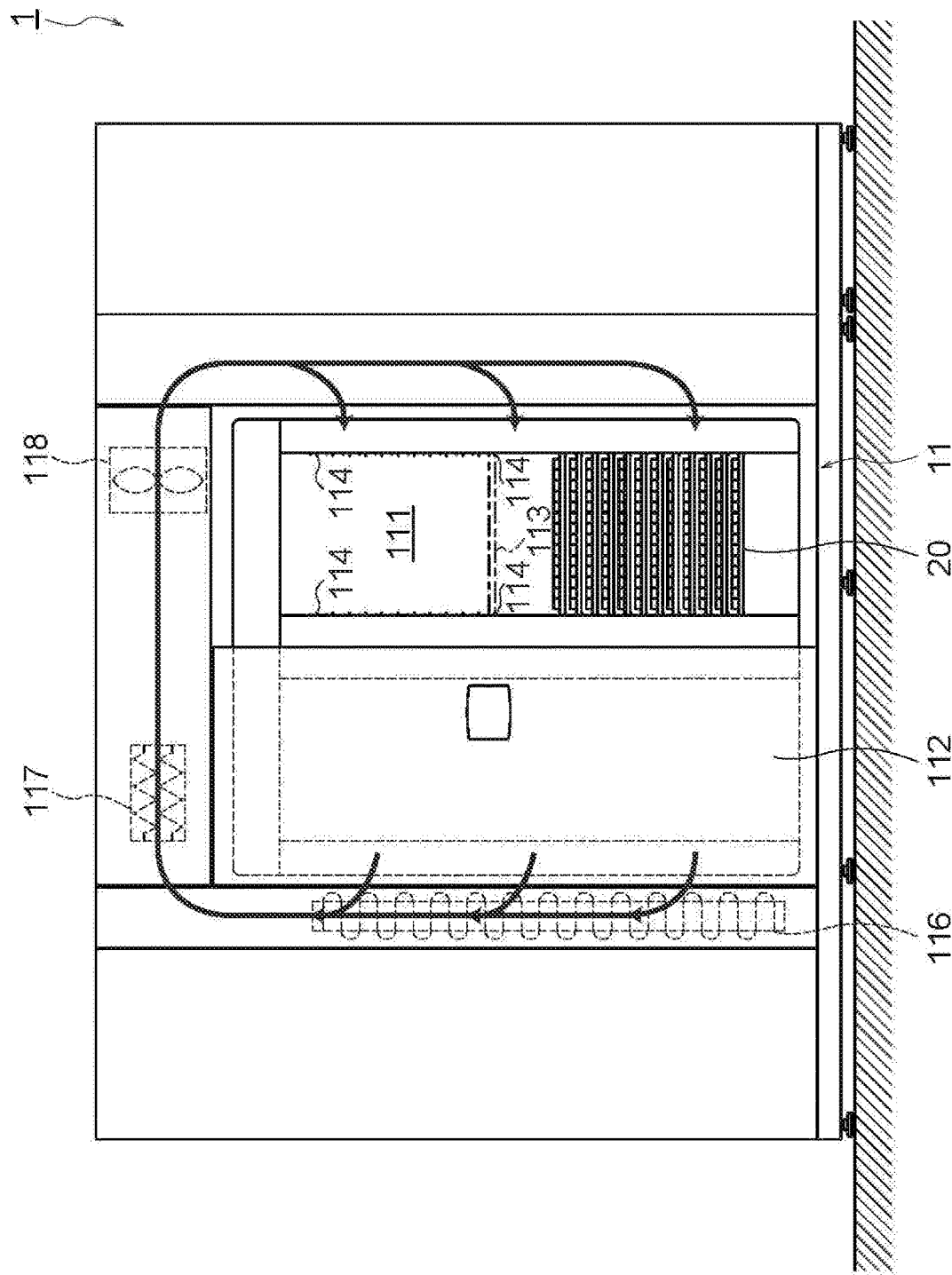
FIG. 1 is a front view illustrating a burn-in device in a first embodiment of the invention.
Figure 2:
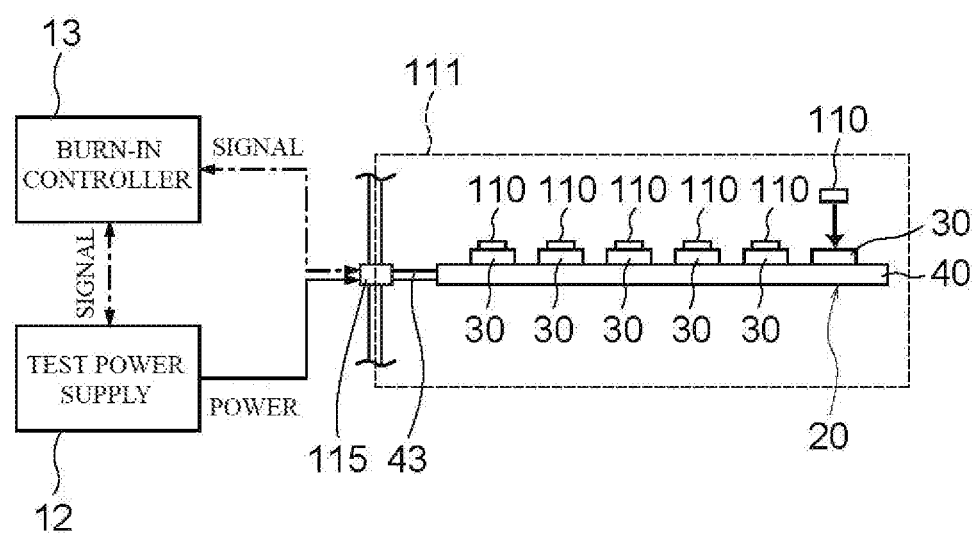
FIG. 2 is a block diagram illustrating a system configuration of the burn-in device in the first embodiment of the invention.

First, an overall configuration of a burn-in device 1 of a first embodiment of the invention will be described with reference to FIGS. 1 and 2. FIG. 1 is a front view of the burn-in device in the first embodiment of the invention and FIG. 2 is a block diagram illustrating a system configuration of the burn-in device of the embodiment.

The burn-in device 1 of the embodiment is a device that performs a burn-in test which is a kind of screening test for extracting an initial defect of a DUT such as an IC chip and removing an initial defective product. As illustrated in FIGS. 1 and 2, the burn-in device 1 includes a burn-in chamber 11 capable of storing a burn-in board 20, a test power supply 12 applying a power voltage to a DUT 110 (see FIG. 2) attached to the burn-in board 20, and a burn-in controller 13 inputting a signal to the DUT 110.

The burn-in device 1 performs screening on the DUT 110 by applying a power supply voltage and a signal to the DUT 110 while applying heat stress (for example, about −55° C. to +180° C.) to the DUT 110 attached to the burn-in board 20 stored in the burn-in chamber 11.

As illustrated in FIG. 1, the burn-in chamber 11 is defined by a heat insulation wall or the like and includes a thermostatic room 111 capable of storing the burn-in board 20 and a door 112 capable of opening and closing the thermostatic room 111. A plurality of slots 113 for storing the burn-in board 20 are provided in the thermostatic room 111. Each slot 113 includes a pair of rails 114 supporting both right and left ends of the burn-in board 20. The burn-in board 20 is carried into the thermostatic room 111 through the door 112 while sliding on the rail 114. In the thermostatic room 111, twenty four stages of slots 113 are provided in two rows so that forty eight burn-in boards 20 can be stored in total.

Additionally, in the same drawing, it is depicted that the thermostatic room 111 is opened while one door (the right door of the drawing) is not illustrated. Accordingly, it is depicted that the other door 112 (the left door of the drawing) is closed. Therefore, twenty four stages of slots 113 on the left side of the drawing are not illustrated. Additionally, the number or arrangement of the slot 113 (that is, the number or positional relationship of the burn-in boards 20 stored in the thermostatic room 111) is not limited to the example illustrated in FIG. 1 and can be arbitrarily set in consideration of the test efficiency or the like.

Further, a connector 115 (see FIG. 2) is provided inside each slot 113 and a connector 43 of the burn-in board 20 inserted into the slot 113 is fittable to the connector 115.

As illustrated in FIG. 2, the connector 115 is electrically connected to the test power supply 12 and the burn-in controller 13. Additionally, FIG. 2 only illustrates one burn-in board 20, but the other burn-in boards 20 are also connected to the test power supply 12 and the burn-in controller 13 in the same manner.

Further, as illustrated in FIG. 1, the burn-in chamber 11 includes a temperature adjuster including an evaporator 116, a heater 117, and a fan 118. The temperature adjuster can control the temperature inside the thermostatic room 111. Specifically, air inside the thermostatic room 111 is cooled by the evaporator 116 or heated by the heater 117 while being circulated in a direction indicated by an arrow illustrated in FIG. 1 by the fan 118. Accordingly, temperature inside the thermostatic room 111 is adjusted. In the embodiment, the air inside the thermostatic room 111 blows from a first side 411 of a burn-in board body 40 toward a second side 412 by the fan 118 (see FIG. 3A). The operations of the evaporator 116, the heater 117, and the fan 118 are controlled by the burn-in controller 13.

The test power supply 12 is connected to each DUT 110 on the burn-in board 20 via the connectors 115 and 43 so as to apply a power supply voltage to each DUT 110 and is controlled by the burn-in controller 13.

In addition to the control of the voltage and the signal applied to the DUT 110 or the adjustment of the temperature inside the thermostatic room 111, the burn-in controller 13 determines the DUT 110 having an abnormal response during a burn-in test as a defective product, stores a serial number (for example, corresponding to the number of the slot 113 and the position on the burn-in board 20) of the DUT 110, and feeds back the test result.

Figure 3:
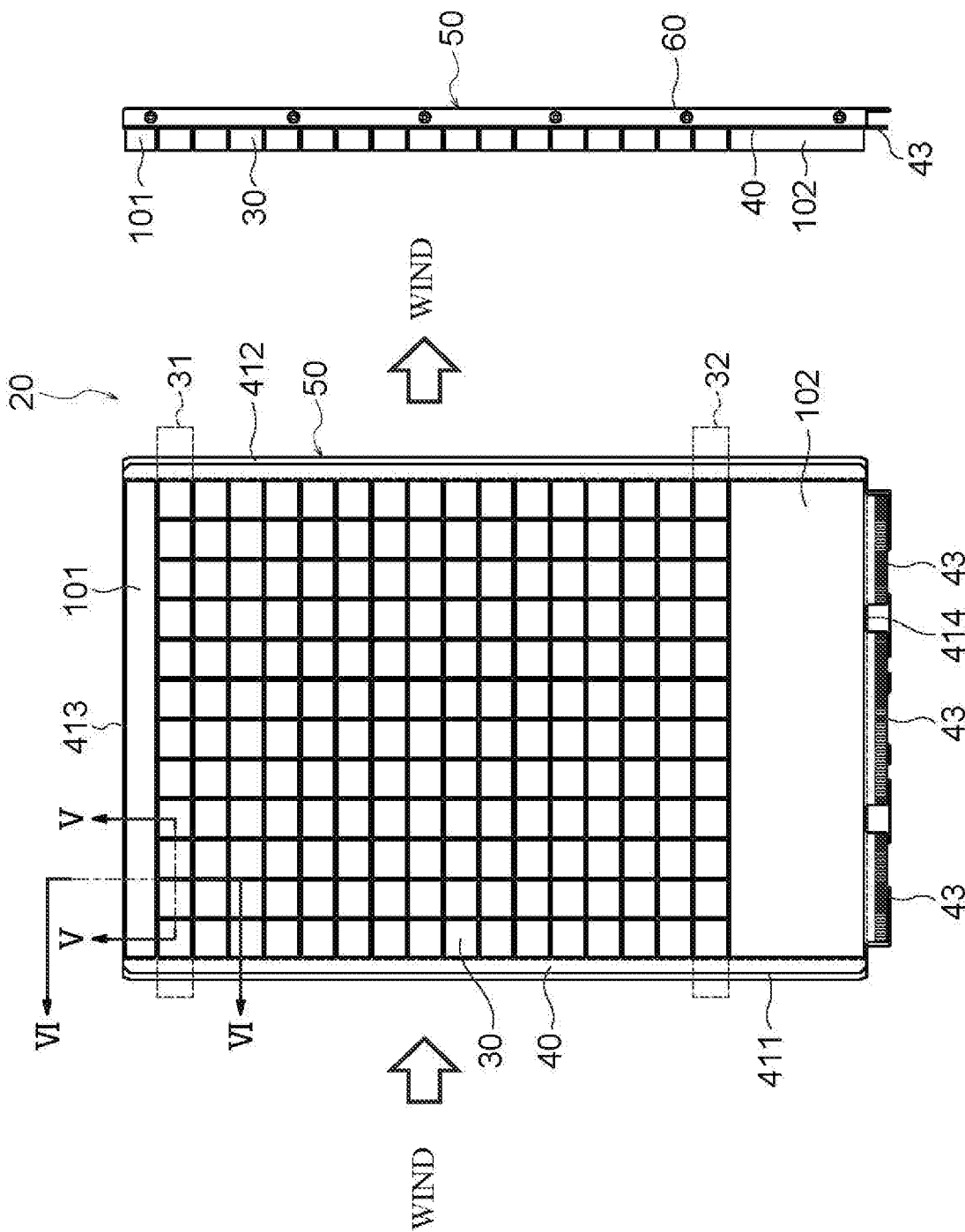
FIG. 3A is a plan view illustrating the burn-in board in the first embodiment of the invention and FIG. 3B is a side view illustrating the burn-in board in the first embodiment of the invention.

Next, the configuration of the burn-in board 20 in the first embodiment of the invention will be described with reference to FIGS. 3 to 6. FIGS. 3A and 3B are diagrams illustrating the burn-in board 20 of the embodiment, FIG. 4 is an exploded perspective view of the burn-in board 20, FIG. 5 is a cross-sectional view taken along a line V-V of FIG. 3A, and FIG. 6 is a cross-sectional view taken along a line VI-VI of FIG. 3A.

Figure 4:
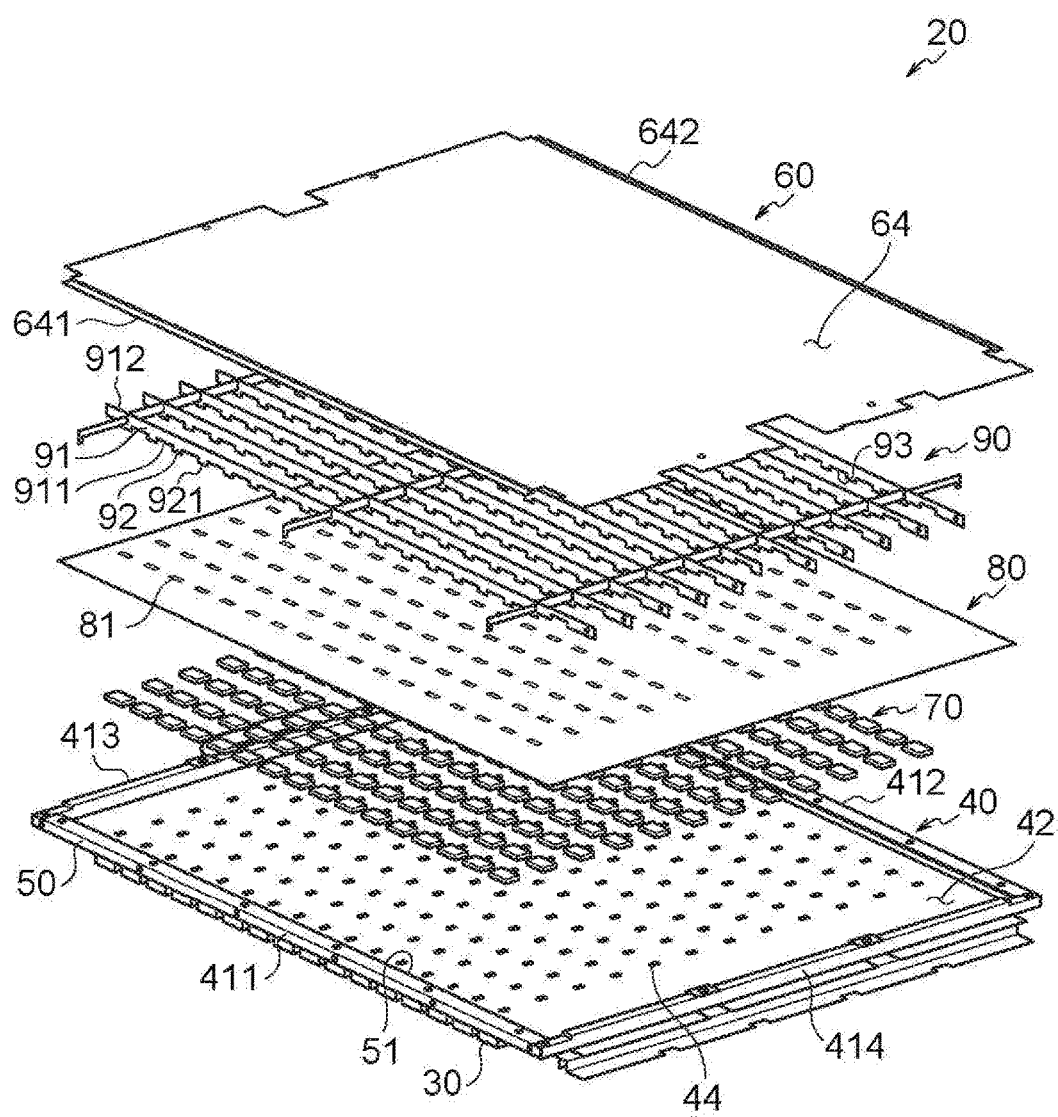
FIG. 4 is an exploded perspective view of the burn-in board in the first embodiment of the invention and is a diagram illustrating the burn-in board viewed from below.

As illustrated in FIGS. 3A to 4, the burn-in board 20 of the embodiment includes a socket 30, a burn-in board body 40, an outer frame 50, and a bottom cover 60. The burn-in board body 40 of the embodiment corresponds to an example of the "first wiring board" of the invention and the bottom cover 60 of the embodiment corresponds to an example of the "first plate" of the invention.

The burn-in board body 40 is a substantially rectangular wiring board on which the plurality of sockets 30 are mounted. The plurality of sockets 30 are arranged in a matrix shape (in this example, 16 rows and 12 columns) on the upper surface 41 of the burn-in board body 40. Although particularly not illustrated in the drawings, each socket 30 includes a pin contacting the terminal of the DUT 110 and the DUT 110 is attachable to each socket 30.

Figure 5:
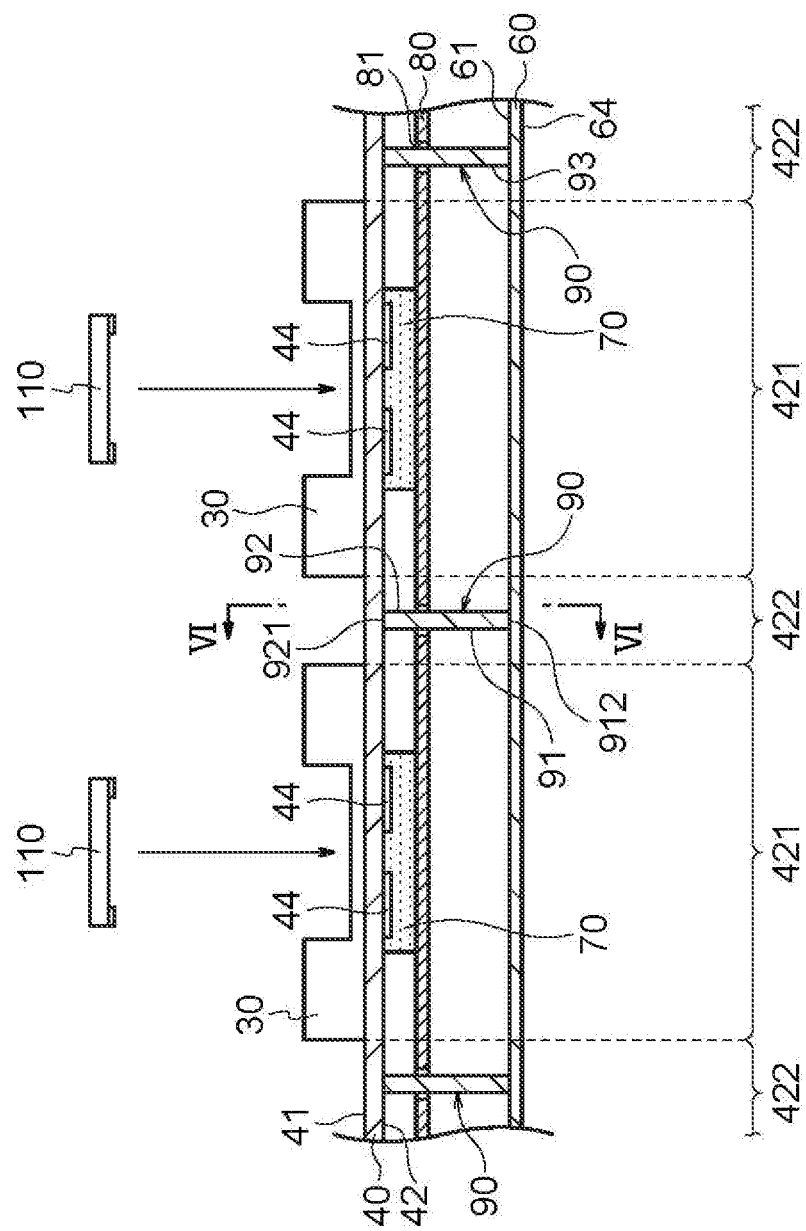
FIG. 5 is a cross-sectional view of the burn-in board in the first embodiment of the invention and is a cross-sectional view taken along a line V-V of FIG. 3A.
Figure 6:
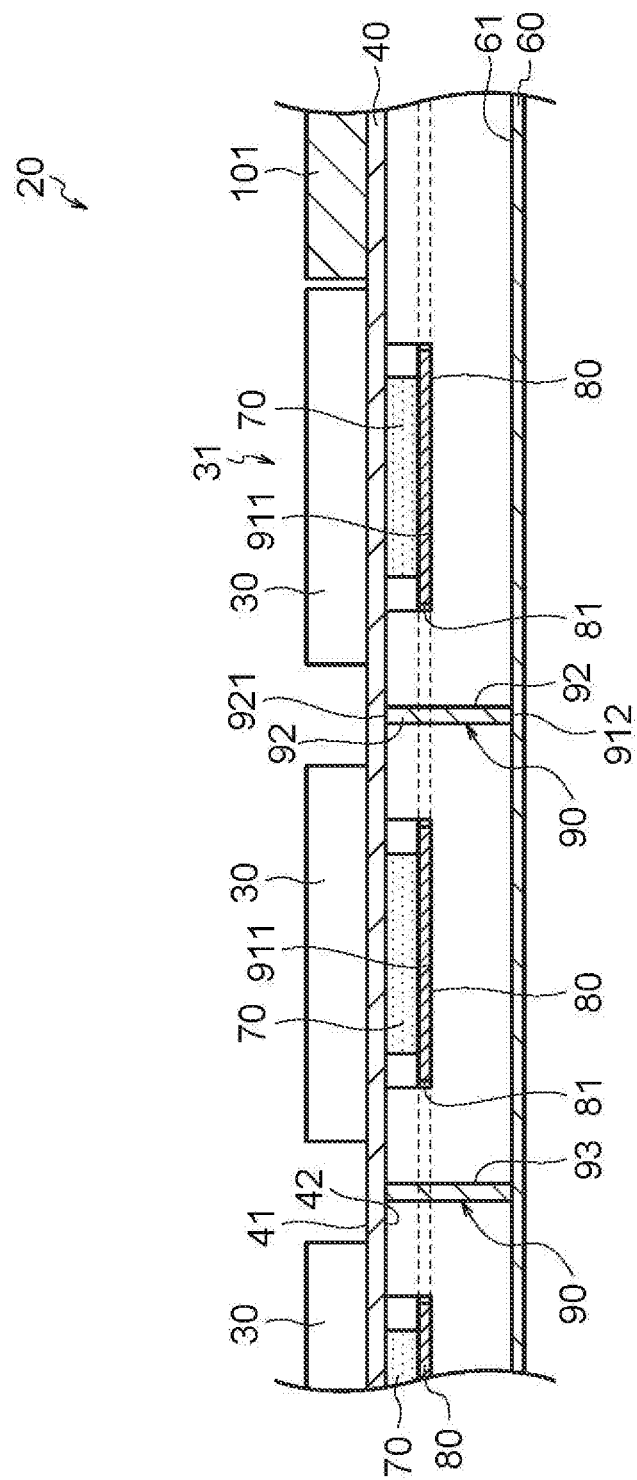
FIG. 6 is a cross-sectional view of the burn-in board in the first embodiment of the invention and is a cross-sectional view taken along a line VI-VI of FIG. 3A.

As illustrated in FIGS. 5 and 6, a lower surface 42 of the burn-in board body 40 includes a first region 421 corresponding to the socket 30 and a second region 422 provided in the periphery of the first region 421. On the first region 421, various electronic parts 44 such as a capacitor used in the burn-in test are mounted. Meanwhile, the second region 422 corresponds to a space between the sockets 30.

The bottom cover 60 is fixed to the lower surface 42 of the burn-in board body 40 via the outer frame 50. The outer frame 50 is a rectangular frame corresponding to the outer edge of the burn-in board body 40 and is fixed to the burn-in board body 40 by threading or the like. A heat conduction sheet 70, a heat conduction plate 80, and a reinforcement frame 90 to be described later are disposed inside an opening 51 of the outer frame 50 (see FIGS. 4 to 6).

The bottom cover 60 is made of a metal material having excellent thermal conductivity such as aluminum or copper. The bottom cover 60 extends substantially in parallel to the burn-in board body 40 and is fixed to the outer frame 50 so as to face the lower surface 42 of the burn-in board body 40. Although not particularly limited, in the embodiment, both ends of the bottom cover 60 are inserted while being slid along grooves formed on the inner surface of the outer frame 50 and the bottom cover 60 is fixed to the outer frame 50. The bottom cover 60 protects the back surface of the burn-in board body 40.

Further, as illustrated in FIGS. 4 to 6, the burn-in board 20 of the embodiment includes a heat conduction sheet 70, a heat conduction plate 80, and a reinforcement frame 90. The heat conduction sheet 70 of the embodiment corresponds to an example of the "heat conductor" of the invention, the heat conduction plate 80 of the embodiment corresponds to an example of the "second plate" of the invention, and the reinforcement frame 90 of the embodiment corresponds to an example of the "reinforcement member" of the invention.

The heat conduction sheet 70 is affixed to the first region 421 corresponding to the socket 30 in the lower surface 42 of the burn-in board body 40. The heat conduction sheet 70 is an individual sheet having electrical insulation and flexibility. Although not particularly limited, as a material forming the heat conduction sheet 70, for example, silicone rubber in which fillers having thermal conductivity such as metal or ceramics are dispersed and held can be exemplified. The heat conduction sheet 70 is in close contact with the lower surface 42 of the burn-in board body 40 while covering the electronic part 44. Additionally, the position of the heat conduction sheet 70 may not correspond to the socket 30.

The heat conduction plate 80 is a single plate-shaped member interposed between the burn-in board body 40 and the bottom cover 60 and extends substantially in parallel to the burn-in board body 40 and the bottom cover 60. The heat conduction plate 80 is made of a metal material having excellent thermal conductivity such as aluminum or copper. The heat conduction plate 80 has an outer shape smaller than the opening 51 of the outer frame 50 and is disposed inside the opening 51 without being fixed to the outer frame 50.

The heat conduction sheet 70 is in close contact with the heat conduction plate 80 and the burn-in board body 40 and the heat conduction plate 80 are thermally connected to each other via the heat conduction sheet 70. Further, the heat conduction plate 80 includes a through-hole 81 into which a protrusion portion 92 (to be described later) of the reinforcement frame 90 is inserted. The through-hole 81 of the embodiment corresponds to an example of the "first through-hole" of the invention.

In this way, in the embodiment, the heat conduction plate 80 is thermally connected to the burn-in board body 40 via the heat conduction sheet 70. For this reason, since the heat generated from the DUT 110 or the burn-in board body 40 in the burn-in test is diffused to the heat conduction plate 80 via the heat conduction sheet 70, a uniform temperature distribution inside the burn-in board 20 can be obtained.

The reinforcement frame 90 is a lattice-shaped frame made of a resin material having electrical insulation. The reinforcement frame 90 is not fixed to any one of the burn-in board body 40 and the bottom cover 60 and is disposed inside the opening 51 of the outer frame 50 so as to be interposed between the burn-in board body 40 and the bottom cover 60. That is, the reinforcement frame 90 is sandwiched by the burn-in board body 40 and the bottom cover 60.

In the embodiment, as illustrated in FIG. 4, each lattice 93 of the reinforcement frame 90 encircles the plurality of heat conduction sheets 70 so that the plurality of heat conduction sheets 70 corresponds to the plurality of sockets 30. However, the invention is not particularly limited thereto. For example, each lattice 93 may encircles only one heat conduction sheet 70 so that one heat conduction sheet 70 corresponds to one socket 30 (see FIG. 6).

As illustrated in FIGS. 4 to 6, the reinforcement frame 90 includes a main body 91 and a protrusion portion 92 protruding from the main body 91 toward the burn-in board body 40. A lower end 912 of the main body 91 contacts an upper surface 61 of the bottom cover 60. Further, the protrusion portion 92 penetrates the through-hole 81 provided in the heat conduction plate 80 and a front end 921 of the protrusion portion 92 contacts the lower surface 42 of the burn-in board body 40.

By the reinforcement frame 90 and the bottom cover 60, the deflection of the burn-in board body 40 at the time of inserting and extracting the DUT 110 into and from the socket 30 is suppressed. At this time, the front end 921 of the plate-shaped protrusion portion 92 contacts the second region 422 of the lower surface 42 of the burn-in board body 40. For this reason, it is possible to decrease a space between the sockets 30 and to suppress a decrease in mounting density of the socket 30 in the burn-in board 20.

Further, the lower end 912 of the main body 91 of the reinforcement frame 90 contacts the upper surface 61 of the bottom cover 60 and the upper end 911 of the main body 91 contacts the heat conduction plate 80. For this reason, the heat conduction plate 80 is pressed by the bottom cover 60 with the reinforcement frame 90 and the adhesion between the heat conduction plate 80 and the heat conduction sheet 70 or the adhesion between the heat conduction sheet 70 and the burn-in board body 40 is improved. Further, in the embodiment, since the heat conduction sheet 70 and the heat conduction plate 80 are pressed by using the reinforcement frame 90 for suppressing the deflection, an increase in number of parts can be suppressed.

Further, the burn-in board 20 of the embodiment includes shielding members 101 and 102.

As illustrated in FIGS. 3A, 3B, and 6, one shielding member 101 extends in the upper surface 41 of the burn-in board body 40 along a third side 413 of the burn-in board body 40. Here, the plurality of sockets 30 arranged in a matrix shape include a first socket row 31 including the plurality of sockets 30 arranged along the third side 413. The shielding member 101 is interposed between the first socket row 31 and the third side 413 of the burn-in board body 40 and buries a space between the first socket row 31 and the third side 413. Additionally, the third side 413 is substantially orthogonal to the first and second sides 411 and 412.

Similarly, the other shielding member 102 also extends in the upper surface 41 of the burn-in board body 40 along a fourth side 414 of the burn-in board body 40. The plurality of sockets 30 arranged in a matrix shape include a second socket row 32 including the plurality of sockets 30 arranged along the fourth side 414. The shielding member 102 is interposed between the second socket row 32 and the fourth side 414 of the burn-in board body 40 and buries a space between the second socket row 32 and the fourth side 414. Similarly to the third side 413, the fourth side 414 is substantially orthogonal to the first and second sides 411 and 412.

Each of the shielding members 101 and 102 is a dummy block-shaped member made of a metal material or a resin material and has substantially the same height as the socket 30. Since such shielding members 101 and 102 are provided, it is possible to suppress a problem that most of the wind supplied to the burn-in board 20 by the fan 118 passes through only a region without the socket 30 in the upper surface 41 of the burn-in board body 40. Accordingly, since the amount of the wind colliding with the socket 30 and the DUT 110 can be increased, a temperature distribution can be further uniform.

Second Embodiment

Figure 7:
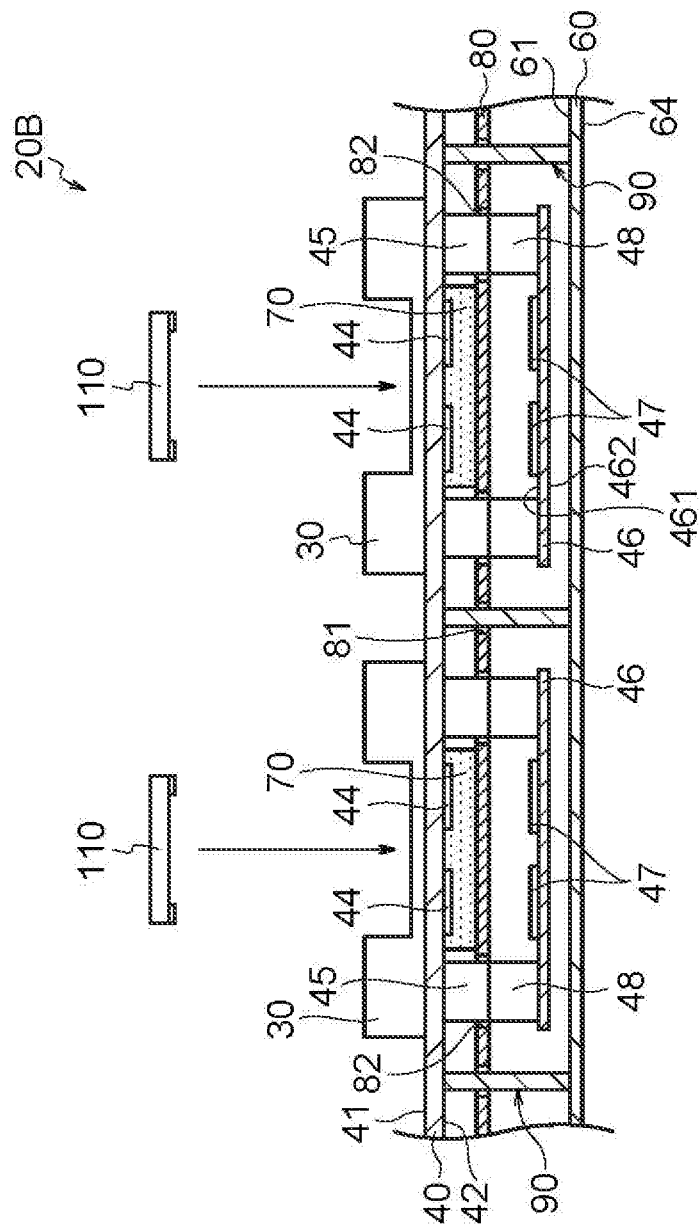
FIG. 7 is a cross-sectional view of a burn-in board in a second embodiment of the invention.

FIG. 7 is a cross-sectional view of a burn-in board in a second embodiment of the invention.

This embodiment is different from the first embodiment in that the burn-in board body 40 includes a connector 45 and the burn-in board 20B includes a daughter board 46, but the other configurations are the same. Hereinafter, the burn-in board 20B of the second embodiment will be described by focusing on only the difference from the first embodiment and the description of the same components as those of the first embodiment will be omitted by giving the same reference numerals thereto.

The burn-in board 20B of the embodiment includes a daughter board 46 in addition to the configuration of the burn-in board 20 described in the first embodiment.

As illustrated in FIG. 7, the daughter board 46 is disposed so as to face the lower surface 42 of the burn-in board body 40. The connector 45 is mounted on the lower surface 42 of the burn-in board body 40 in addition to the electronic part 44. Further, the electronic part 47 and the connector 48 are also mounted on an upper surface 461 of the daughter board 46. The connectors 45 and 48 are disposed to face each other and are connected to each other. The burn-in board body 40 is electrically connected to the daughter board 46 via the connectors 45 and 48. Additionally, the electronic part may be mounted on a lower surface 462 of the daughter board 46.

In the embodiment, a through-hole 82 is formed in the heat conduction plate 80. The connectors 45 and 48 are inserted into the through-hole 82. As a result, the daughter board 46 is interposed between the heat conduction plate 80 and the bottom cover 60. The daughter board 46 of the embodiment corresponds to an example of the "second wiring board" of the invention and the through-hole 82 of the embodiment corresponds to an example of the "second through-hole" of the invention.

In the embodiment, the heat conduction plate 80 is thermally connected to the burn-in board body 40 via the heat conduction sheet 70 similarly to the first embodiment. For this reason, since the heat generated from the DUT 110 and the burn-in board body 40 is diffused to the heat conduction plate 80 via the heat conduction sheet 70 in the burn-in test, a uniform temperature distribution inside the burn-in board 20B can be obtained.

Third Embodiment

Figure 8:
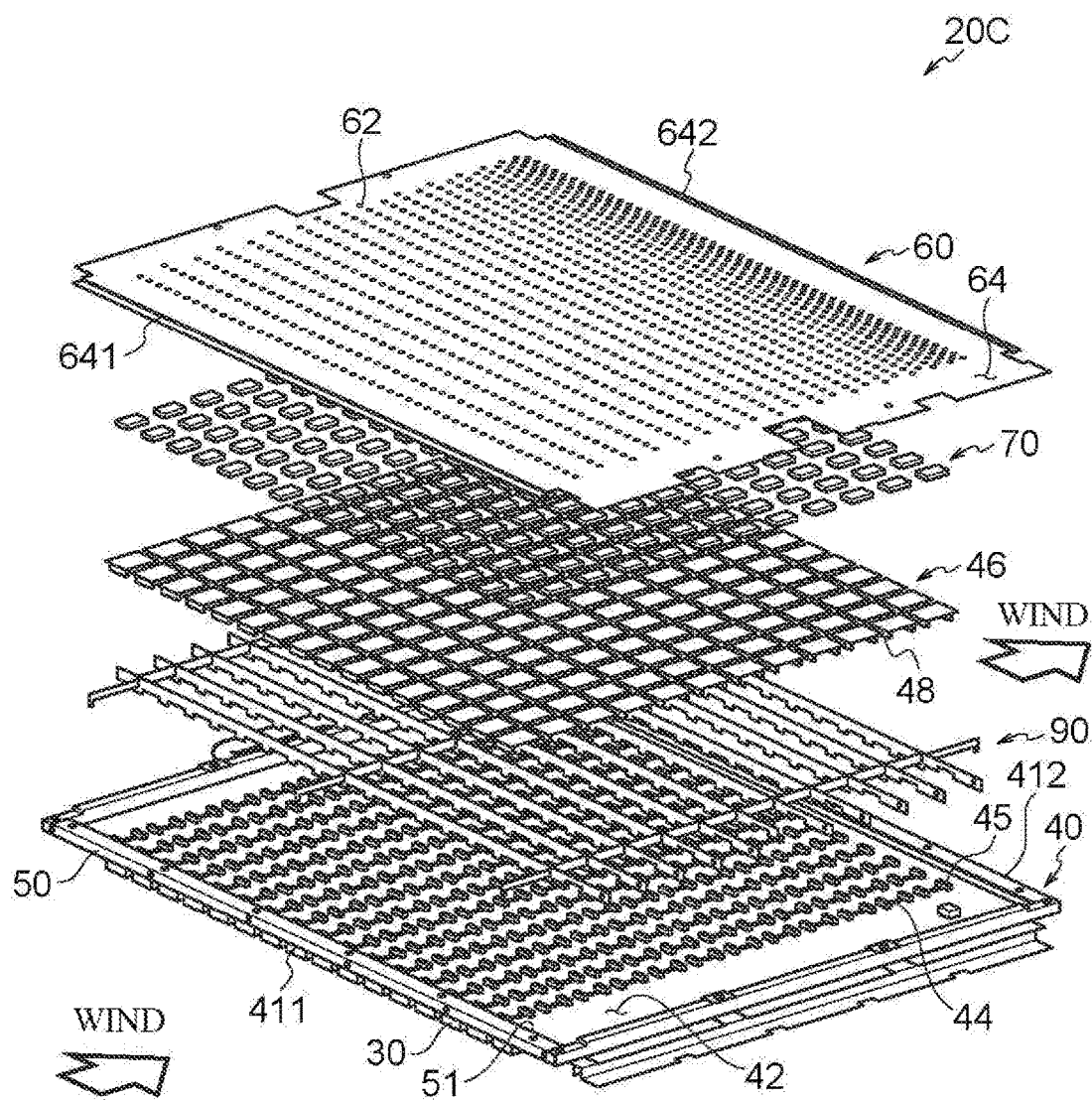
FIG. 8 is an exploded perspective view of a burn-in board in a third embodiment of the invention and is a diagram illustrating the burn-in board viewed from below.
Figure 9:
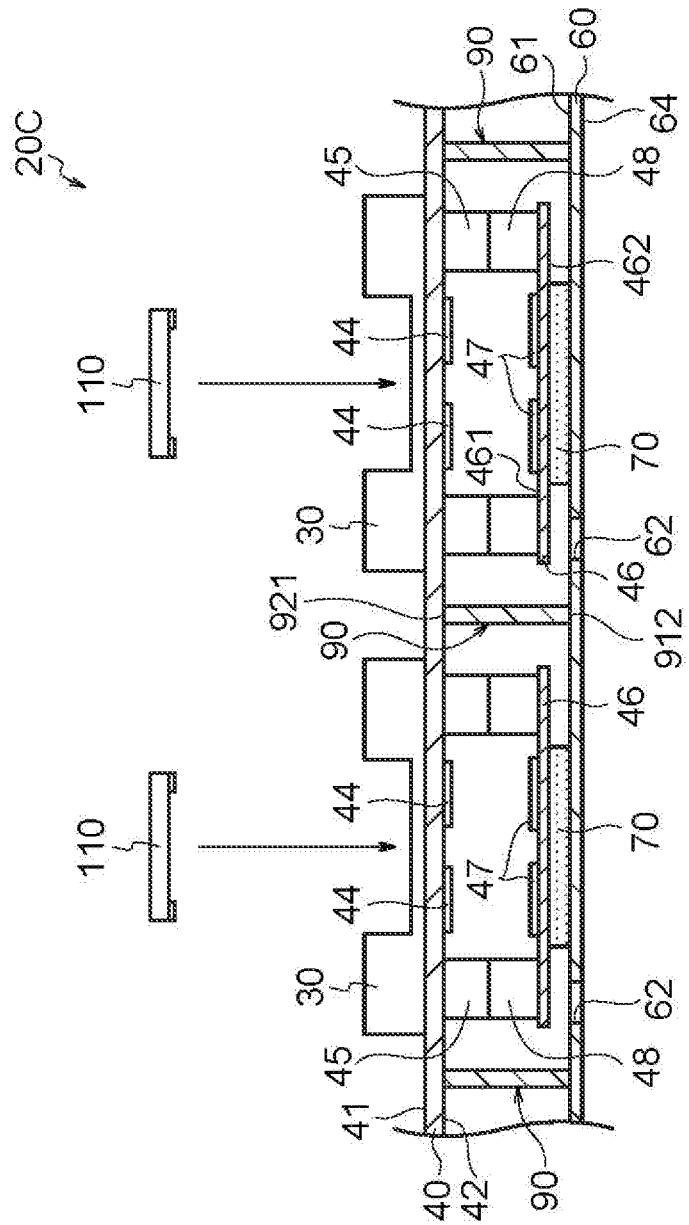
FIG. 9 is a cross-sectional view of the burn-in board in the third embodiment of the invention.
Figure 10:
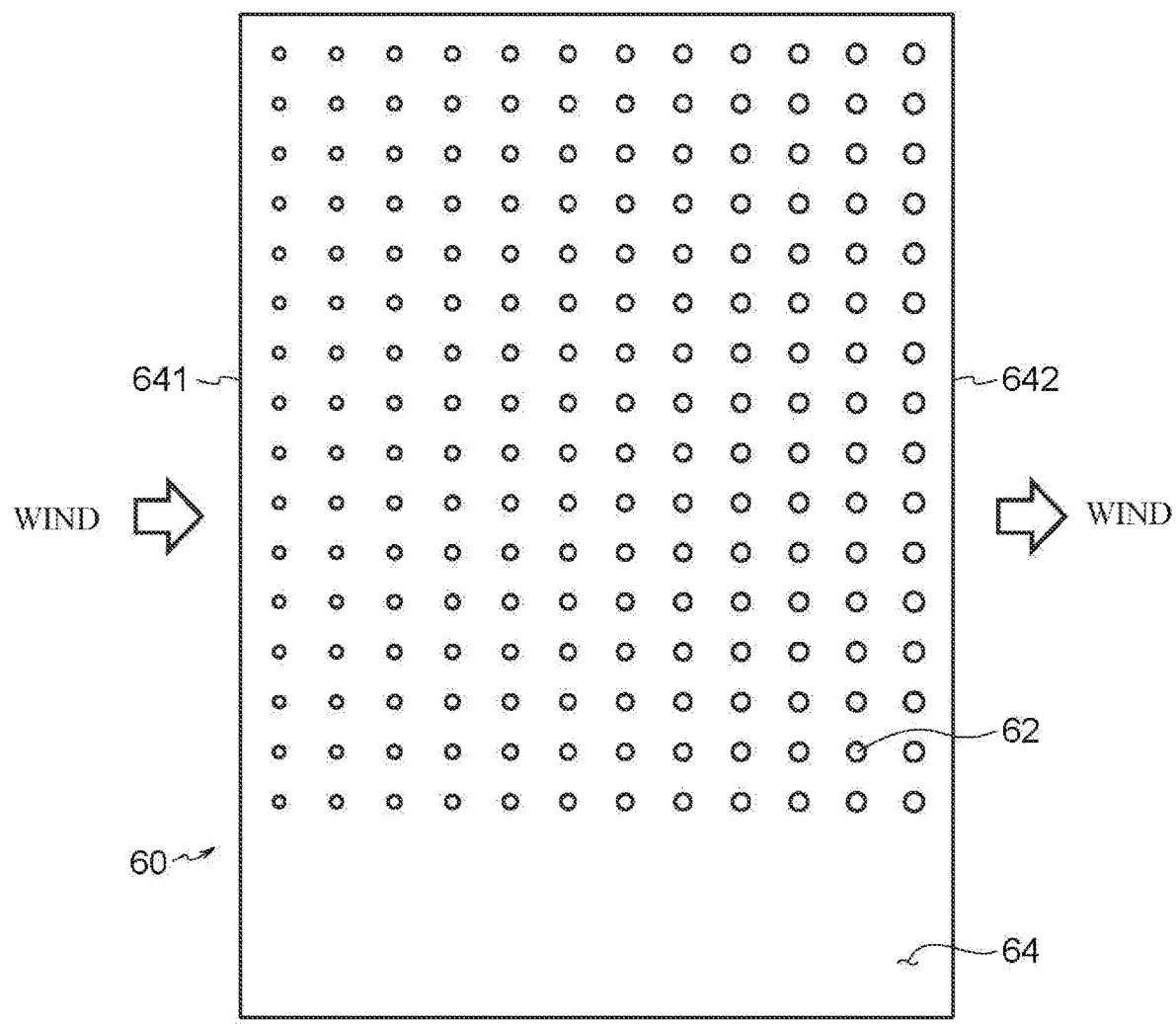
FIG. 10 is a plan view illustrating a modified example of a bottom cover in the third embodiment of the invention.

FIG. 8 is an exploded perspective view of a burn-in board in a third embodiment of the invention, FIG. 9 is a cross-sectional view of the burn-in board in the third embodiment of the invention, and FIG. 10 is a plan view illustrating a modified example of a bottom cover in the third embodiment of the invention.

This embodiment is different from the second embodiment in terms of (1) the presence of the heat conduction plate 80, (2) the installation position of the heat conduction sheet 70, and (3) the configuration of the bottom cover 60, but the other configurations are the same. Hereinafter, the burn-in board 20C of the third embodiment will be described by focusing on only the difference from the second embodiment and the description of the same components as those of the second embodiment will be omitted by giving the same reference numerals thereto.

As illustrated in FIGS. 8 and 9, the burn-in board 20C of the embodiment does not include the heat conduction plate 80 differently from the burn-in board 20B of the second embodiment. Further, the heat conduction sheet 70 is interposed between the lower surface 462 of the daughter board 46 and the bottom cover 60. The heat conduction sheet 70 is in close contact with the lower surface 462 of the daughter board 46 and the upper surface 61 of the bottom cover 60.

Further, the bottom cover 60 of the embodiment includes a plurality of through-holes 62. As illustrated in FIG. 8, the plurality of through-holes 62 are formed on the bottom cover 60 so that the number of the through-holes 62 per unit area of the bottom cover 60 increases from a first side 641 of the bottom cover 60 toward a second side 642 thereof. Accordingly, the density of the through-hole 62 increases from the first side 641 toward the second side 642. Here, the density of the through-hole 62 means the ratio of the opening area of the through-hole 62 per unit area of the lower surface 64 of the bottom cover 60. Additionally, in the embodiment, the plurality of through-holes 62 have substantially the same size, but the invention is not particularly limited thereto.

In the through-hole 62, the opening area of each through-hole 62 may be changed. That is, as illustrated in FIG. 10, the plurality of through-holes 62 may be formed in the bottom cover 60 so as to increase in size from the first side 641 of the bottom cover 60 toward the second side 642 thereof. Also in this case, the density of the through-hole 62 increases from the first side 641 toward the second side 642.

Additionally, in this example, in the burn-in test, the wind supplied from the fan 118 flows from the first side 641 of the bottom cover 60 toward the second side 642 thereof. At this time, in the embodiment, the density of the through-hole 62 of the bottom cover 60 increases from the first side 641 toward the second side 642. For this reason, since the amount of the wind introduced via the through-hole 62 on the first side 641 receiving the wind can be equal to the amount of the wind introduced through the through-hole 62 on the second side 642 sending the wind. That is, the wind supplied from the fan 118 uniformly collides with the burn-in board body 40 and the daughter board 46. Accordingly, a uniform temperature distribution inside the burn-in board 20C can be obtained.

Further, in the embodiment, the daughter board 46 connected to the burn-in board body 40 by the connectors 45 and 48 is thermally connected to the bottom cover 60 via the heat conduction sheet 70. For this reason, since the heat generated from the daughter board 46 is diffused to the bottom cover 60 via the heat conduction sheet 70 in the burn-in test, a uniform temperature distribution inside the burn-in board 20C can be obtained. That is, in the embodiment, the bottom cover 60 also has the function of the heat conduction plate 80 described in the first and second embodiments.

Additionally, the configuration of the bottom cover 60 is not limited thereto. When there is a locally hot place in the burn-in test, the opening area of the through-hole 62 per unit area in the vicinity of the place may increase. That is, the density of the through-hole 62 of the bottom cover 60 may be non-uniform. Further, the size of the through-hole 62 may be determined in response to the self-heating amount of the DUT.

Fourth Embodiment

Figure 11:
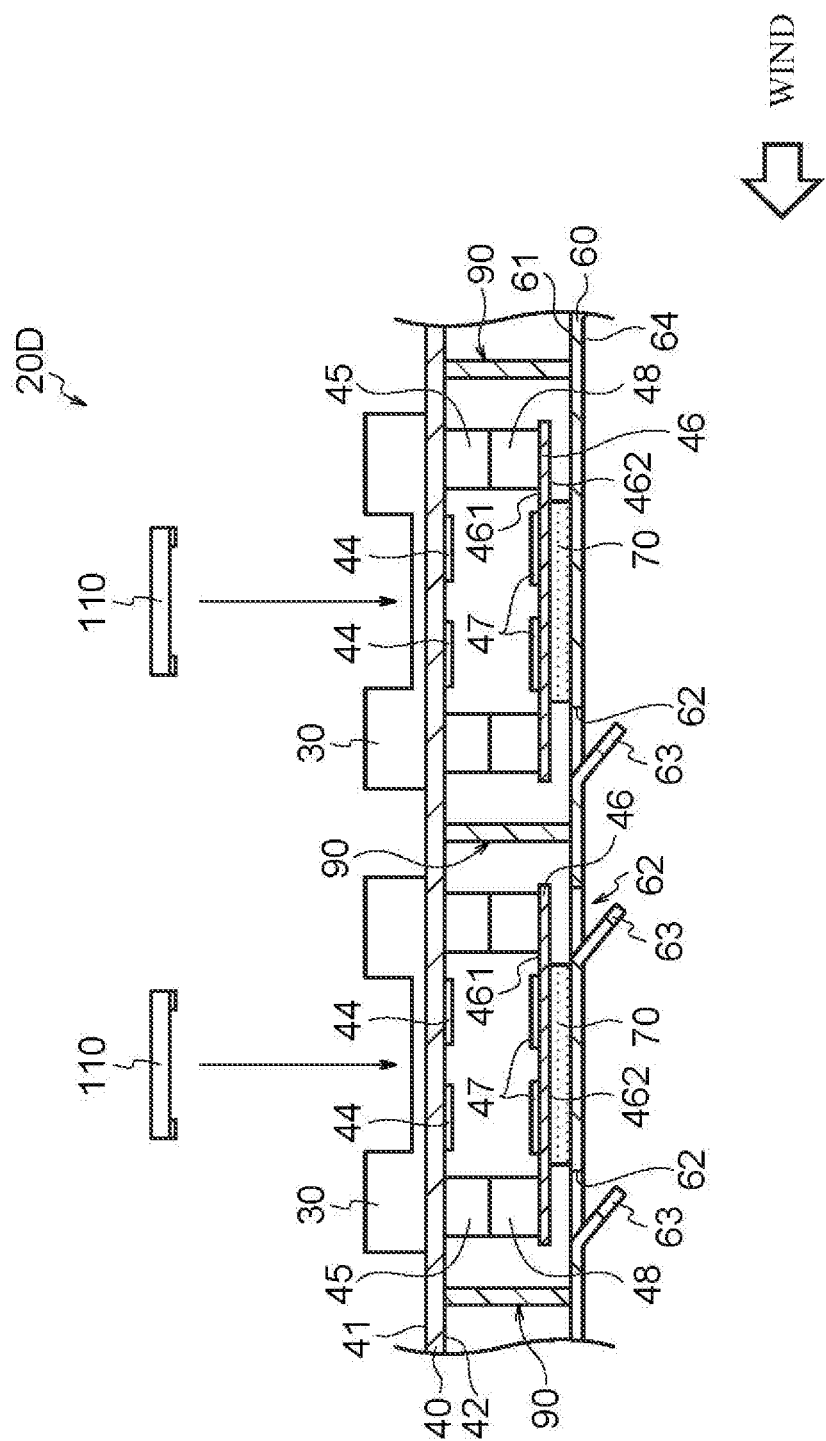
FIG. 11 is a cross-sectional view of a burn-in board in a fourth embodiment of the invention.

FIG. 11 is a cross-sectional view of a burn-in board in a fourth embodiment of the invention.

This embodiment is different from the third embodiment in that a fin 63 is provided in circumferential edges of a plurality of through-holes 62 of a bottom cover 60, but the other configurations are the same. Hereinafter, the burn-in board 20D of the fourth embodiment will be described by focusing on only the difference from the third embodiment and the description of the same components as those of the third embodiment will be omitted by giving the same reference numerals thereto.

As illustrated in FIG. 11, the burn-in board 20D of the embodiment includes a fin 63 standing on the circumferential edge of the through-hole 62 of the bottom cover 60 differently from the burn-in board 20C of the third embodiment. The fin 63 is provided in a portion near the second side 642 in the circumferential edge of the through-hole 62. The through-hole 62 of the embodiment corresponds to an example of the "third through-hole" of the invention and the fin 63 of the embodiment corresponds to an example of the "first fin" of the invention.

In the embodiment, since the wind supplied from the fan 118 and flowing from the first side 641 toward the second side 642 collides with the fin 63 and the wind is taken into the through-hole 62 by the fin 63, the function of the through-hole 62 realizing a uniform temperature distribution inside the burn-in board 20D can be improved.

Further, in the embodiment, the daughter board 46 connected to the burn-in board body 40 by the connectors 45 and 48 is thermally connected to the bottom cover 60 via the heat conduction sheet 70 similarly to the third embodiment. For this reason, since the heat generated from the daughter board 46 is diffused to the bottom cover 60 via the heat conduction sheet 70 in the burn-in test, a uniform temperature distribution inside the burn-in board 20D can be obtained.

Additionally, the above-described embodiments are used to help the comprehension of the invention and do not limit the invention. Thus, the components of the above-described embodiments include all design changes and equivalents belonging to the technical scope of the invention.

Figure 12:
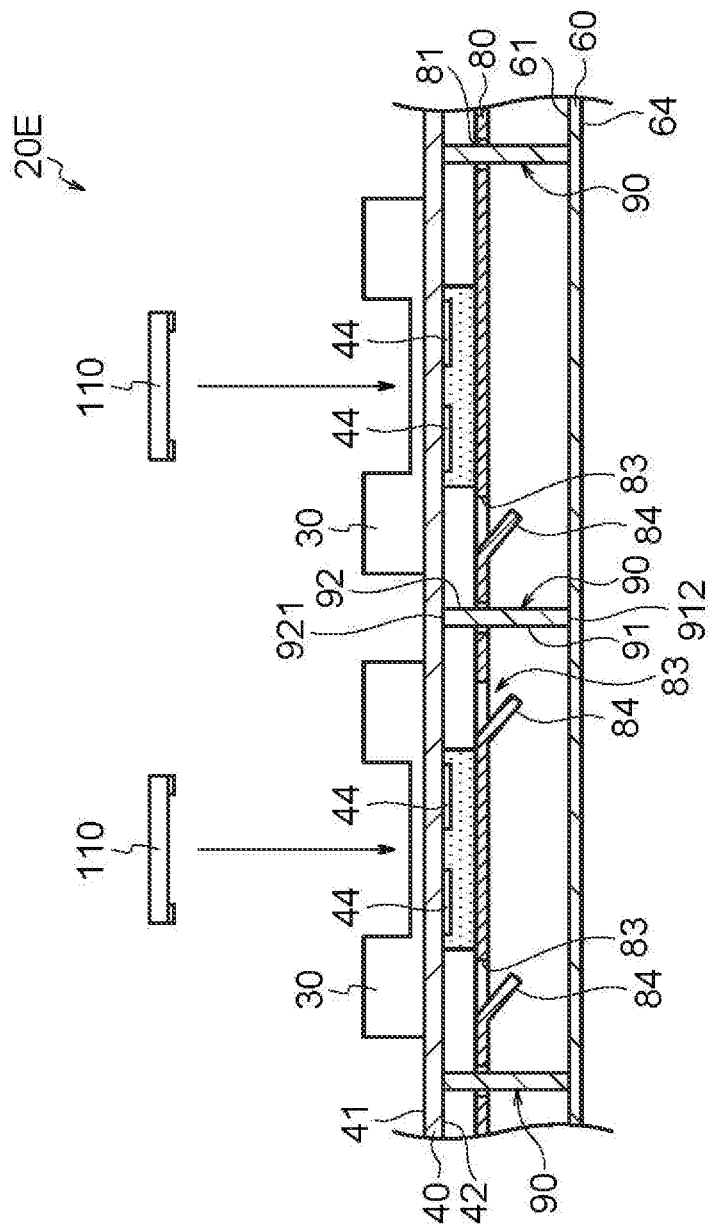
FIG. 12 is a cross-sectional view illustrating a modified example of the burn-in board in the first embodiment of the invention.

For example, as in a burn-in board 20E illustrated in FIG. 12, the heat conduction plate 80 may include a plurality of through-holes 83. At this time, the plurality of through-holes 83 may be formed in the heat conduction plate 80 so that the density of the through-hole 83 increases from one end of the heat conduction plate 80 toward the other end thereof in the same manner as the through-hole 62 of the third embodiment.

Further, as in the burn-in board 20E illustrated in FIG. 12, the heat conduction plate 80 may include a fin 84 in the circumferential edge of the through-hole 83. At this time, the fin 84 may be provided in the other end side portion of the circumferential edge of the through-hole 83 in the same manner as the fin 63 of the fourth embodiment.

Additionally, FIG. 12 is a cross-sectional view illustrating a modified example of the burn-in board in the first embodiment of the invention. The through-hole 83 of the embodiment corresponds to an example of the "fourth through-hole" of the invention and the fin 84 of the embodiment corresponds to an example of the "second fin" of the invention.

Further, although particularly not illustrated in the drawings, in the burn-in board 20E illustrated in FIG. 12, the bottom cover 60 may include a plurality of through-holes similarly to the through-hole 62 of the third embodiment. Similarly to the fin 63 of the fourth embodiment, the bottom cover 60 may have a fin formed in the circumferential edge of the through-hole.

Further, although particularly not illustrated in the drawings, the burn-in board 20B of the second embodiment illustrated in FIG. 7 may include another heat conduction sheet 70 (see FIG. 9) interposed between the daughter board 46 and the bottom cover 60 in addition to the heat conduction sheet 70 interposed between the burn-in board body 40 and the heat conduction plate 80.

EXPLANATIONS OF LETTERS OR NUMERALS

1 BURN-IN DEVICE
11 BURN-IN CHAMBER
116 EVAPORATOR
117 HEATER
118 FAN
12 TEST POWER SUPPLY
13 BURN-IN CONTROLLER
20, 20B to 20E BURN-IN BOARD
30 SOCKET 31, 32 SOCKET ROW
40 BURN-IN BOARD BODY
411 to 414 FIRST TO FOURTH SIDES
421 FIRST REGION
422 SECOND REGION
43 CONNECTOR
44 ELECTRONIC PART
45 CONNECTOR
46 DAUGHTER BOARD
47 ELECTRONIC PART
48 CONNECTOR
50 OUTER FRAME
60 BOTTOM COVER
62 THROUGH-HOLE
63 FIN
641 FIRST SIDE
642 SECOND SIDE
70 HEAT CONDUCTION SHEET
80 HEAT CONDUCTION PLATE
81 to 83 THROUGH-HOLE
84 FIN
90 REINFORCEMENT FRAME
91 MAIN BODY
92 PROTRUSION PORTION
93 LATTICE
101, 102 SHIELDING MEMBER
110 DUT

The invention claimed is:

1. A burn-in board comprising:
sockets;
a first wiring board including a first main surface on which the sockets are mounted and a second main surface being on the side opposite to the first main surface;
a reinforcement frame contacting the second main surface;
a first plate contacting the reinforcement frame;
a second plate interposed between the first wiring board and the first plate; and
a heat conductor thermally connecting the first wiring board to the second plate, wherein
the reinforcement frame presses the second plate toward the heat conductor,
the reinforcement frame includes:
 a main body; and
 a convex portion protruding from the main body toward the first wiring board,
the second plate has a first through-hole into which the convex portion is inserted,
the convex portion contacts the first wiring board, and
the main body contacts the second plate.

2. The burn-in board according to claim 1, wherein
the first wiring board includes a first connector mounted on the second main surface,
the burn-in board further comprises a second wiring board which includes a second connector connected to the first connector and which is interposed between the second plate and the first plate, and
the second plate has a second through-hole into which at least one of the first and second connectors is inserted.

3. The burn-in board according to claim 1, wherein
the first plate has third through-holes.

4. The burn-in board according to claim 3, wherein
the first plate includes a first fin standing on a circumferential edge of the third through-hole.

5. The burn-in board according to claim 1, wherein
the second plate has fourth through-holes.

6. The burn-in board according to claim 5, wherein
the second plate includes a second fin standing on a circumferential edge of the fourth through-hole.

7. The burn-in board according to claim 1, wherein
the burn-in board further comprises a shielding block extending along an outer edge of the first wiring board, and
when viewed from a plan view, the shielding block is interposed between the outer edge of the first wiring board and a row of the sockets arranged along the outer edge.

8. The burn-in board according to claim 1, wherein
the reinforcement frame member is a lattice-shaped frame member contacting a region corresponding to a gap between the sockets in the second main surface.

9. The burn-in board according to claim 1, wherein
the burn-in board further comprises an outer frame to which the first wiring board is fixed and to which the first plate is fixed, and
the reinforcement frame is disposed inside the outer frame.

10. A burn-in device comprising:
the burn-in board according to claim 1;
a chamber which stores the burn-in board;
a test power supply which applies a power voltage to the DUT; and
a controller which inputs a signal to the DUT.

11. A burn-in board comprising:
sockets;
a first wiring board including a first main surface on which the sockets are mounted and a second main surface which is on the side opposite to the first main surface and on which a first connector is mounted;
a reinforcement frame contacting the second main surface;
a first plate contacting the reinforcement frame;
a second wiring board which includes a second connector connected to the first connector and which is interposed between the first wiring board and the first plate; and
a heat conductor provided between the second wiring board and the first plate and thermally connecting the second wiring board to the first plate, wherein
the reinforcement frame is a lattice-shaped frame contacting a region corresponding to a gap between the sockets in the second main surface.

12. The burn-in board according to claim 11, wherein
the burn-in board further comprises an outer frame to which the first wiring board is fixed and to which the first plate is fixed, and
the reinforcement frame is disposed inside the outer frame.

13. A burn-in device comprising:
the burn-in board according to claim 11;
a chamber which stores the burn-in board;
a test power supply which applies a power voltage to the DUT; and
a controller which inputs a signal to the DUT.

14. The burn-in board according to claim 11, wherein
the first plate has third through-holes.

15. The burn-in board according to claim 11, wherein
the first plate includes a first fin standing on a circumferential edge of the third through-hole.

16. The burn-in board according to claim 11, wherein
the burn-in board further comprises a shielding block extending along an outer edge of the first wiring board, and when viewed from a plan view, the shielding block is interposed between the outer edge of the first wiring board and a row of the sockets arranged along the outer edge.

* * * * *